(12) United States Patent
Gamliel

(10) Patent No.: US 7,616,063 B1
(45) Date of Patent: Nov. 10, 2009

(54) FREQUENCY SYNTHESIZER USING A PHASE-LOCKED LOOP AND SINGLE SIDE BAND MIXER

(75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 70 days.

(21) Appl. No.: 11/731,211

(22) Filed: Mar. 29, 2007

(51) Int. Cl.
*H03L 7/08* (2006.01)

(52) U.S. Cl. .......................... 331/1 A; 331/16; 331/18; 455/203; 455/323

(58) Field of Classification Search ................. 331/1 A, 331/16, 18; 332/170; 375/270, 277, 301, 375/321; 455/47, 109, 203, 323
See application file for complete search history.

(56) References Cited

U.S. PATENT DOCUMENTS

| | | | | |
|---|---|---|---|---|
| 4,360,788 A | * | 11/1982 | Erps et al. ................... | 331/1 A |
| 4,573,023 A | * | 2/1986 | Cok et al. ................... | 331/1 A |
| 4,641,101 A | | 2/1987 | Selim ......................... | 327/117 |
| 4,882,549 A | * | 11/1989 | Galani et al. ................. | 331/14 |
| 5,142,247 A | | 8/1992 | Lada et al. ................... | 331/14 |
| 5,216,387 A | | 6/1993 | Telewski et al. .............. | 331/11 |
| 5,260,979 A | | 11/1993 | Parker et al. ................. | 375/366 |
| 5,339,050 A | | 8/1994 | Llewellyn .................... | 331/16 |
| 5,343,168 A | * | 8/1994 | Guthrie ....................... | 331/16 |
| 5,420,545 A | | 5/1995 | Davis et al. .................. | 331/17 |
| 5,550,515 A | | 8/1996 | Liang et al. .................. | 331/11 |
| 5,796,311 A | | 8/1998 | Ishii .......................... | 331/1 R |
| 5,939,949 A | | 8/1999 | Olgaard et al. ............... | 331/17 |
| 6,115,586 A | * | 9/2000 | Bezzam et al. ............... | 455/112 |
| 6,788,157 B2 | | 9/2004 | Clarke ........................ | 331/74 |
| 6,911,868 B1 | | 6/2005 | Kumar ........................ | 331/16 |
| 6,977,556 B1 | | 12/2005 | Petrovic et al. .............. | 331/18 |

FOREIGN PATENT DOCUMENTS

GB 2135544 * 8/1984
GB 2183946 * 6/1987

* cited by examiner

*Primary Examiner*—Robert Pascal
*Assistant Examiner*—Levi Gannon
(74) *Attorney, Agent, or Firm*—Siegmar Silber

(57) ABSTRACT

A frequency synthesizer is built using a phase locked loop incorporating a single side band mixer either in the feedback loop or in the input. The single side band mixer is preferably realized with digital logic and FETs, and the resulting frequency synthesizer simultaneously improves control over the frequency resolution, noise floor and operating frequency range.

23 Claims, 6 Drawing Sheets

| freq | dBm(RFout) |
|---|---|
| 0.0000 Hz | -39.559 |
| 100.0 kHz | -321.047 |
| 200.0 kHz | -54.005 |
| 300.0 kHz | -320.627 |
| 99.70 MHz | -47.338 |
| 99.80 MHz | -318.445 |
| 99.90 MHz | -11.554 |
| 100.0 MHz | -331.011 |
| 100.1 MHz | -66.807 |
| 100.2 MHz | -317.527 |
| 100.3 MHz | -51.766 |
| 199.8 MHz | -53.076 |
| 199.9 MHz | -322.291 |
| 200.0 MHz | -42.062 |
| 200.1 MHz | -324.546 |
| 200.2 MHz | -47.312 |
| 299.9 MHz | -39.846 |
| 300.0 MHz | -328.794 |
| 300.1 MHz | -23.756 |

| freq | ConvLoss |
|---|---|
| 99.90 MHz | -7.554 |

Fig. 6

FREQUENCY SYNTHESIZER USING A PHASE-LOCKED LOOP AND SINGLE SIDE BAND MIXER

CROSS REFERENCE TO RELATED APPLICATIONS

N/A

STATEMENT REGARDING FEDERALLY SPONSORED RESEARCH OR DEVELOPMENT

N/A

TECHNICAL FIELD

The present invention relates generally to frequency synthesizers that incorporate phase locked loop circuits and single side band mixers, implementing these features using specific digital logic elements to provide frequency synthesizers with improved control over the frequency resolution, noise floor and operating frequency range.

BACKGROUND INFORMATION

Frequency synthesizers are used in a wide range of electronic equipment, particularly in radio and television tuners, cable modems and other high-frequency data communication equipment, and test equipment, therefore in many of these applications a wide frequency output range with low noise is desired and, in the past, it has been common to achieve these ends using a circuit based on a phase-locked loop (PLL) control system.

A phase-locked loop is a closed-loop feedback control system that generates an output signal in relation to the frequency and phase of an input reference signal, automatically raising or lowering the frequency of a voltage controlled oscillator until it matches the reference signal in both frequency and phase. This technique is widely used in radio, telecommunications, computers and other electronic applications and facilitates the stablization of a generated signal or the detection of signals in the presence of noise. The technique of constructing an integrated circuit to hold a complete phase-locked loop building block is well known in the art and is widely used in modern electronic devices, with signal frequencies from a fraction of a cycle per second up to many gigahertz.

The PLL circuits discussed herein are constructed using analog circuitry. The most common form of analog PLL is constructed from a phase detector, a low-pass filter and a voltage-controlled oscillator (VCO) placed in a negative feedback configuration. The PLLs discussed herein also contain frequency dividers in the feedback path and in the reference path in order to make the PLL output frequency an integer multiple of the reference signal frequency. Under initial conditions, a first assumption is that the VCO is generating an output signal that is likely to be at nearly the same frequency as the reference signal. If the phase from the VCO output signal falls behind that of the reference signal, a charge pump within the phase detector changes the control voltage output from the phase detector so that the VCO frequency increases. Likewise, if the VCO output signal phase creeps ahead of the reference, the phase detector causes the charge pump to change the control voltage to slow down the VCO. The low-pass filter serves the function of smoothing out the abrupt changes in control voltage from the charge pump. Since initially the VCO output signal may be far from the reference frequency, practical phase detectors may also respond to frequency differences, so as to increase the lock-in range of allowable inputs.

A well known method of achieving a wide frequency range for either single or multiple frequency bands up to and even beyond 2000 MHz is to have a separate voltage-controlled oscillator (VCO) working with the PLL for each frequency band. This technique requires significantly more components than a single-VCO circuit and adds more sources of noise to the circuit.

One method for addressing the problem of a wide frequency range while maintaining low noise is taught by U.S. Pat. No. 5,796,311 entitled PHASE-LOCKED LOOP CIRCUIT. Multiple pre-scaler circuits are used, each dividing the output signal frequency by a predetermined number. These separate pre-scaled signals are then combined back together to feed into the phase comparator of the PLL as a single signal. This approach adds considerable complexity to the circuit as multiple pre-scaling circuits are required.

Another method of providing a wide frequency range is taught by U.S. Pat. No. 6,788,157 entitled PROGRAMMABLE FREQUENCY SYNTHESIZER which discloses the use of a regenerative frequency divider and programmable integer divider to provide wideband frequency coverage from a single narrowband oscillator. However, the noise reduction provided by this circuit is quite limited, with no more than 3 dB of noise reduction realized by each of the three frequency divider elements disclosed in the invention.

Still another method of providing a wide frequency range along with improved noise performance is taught by U.S. Pat. No. 6,977,556 entitled RATIONAL FREQUENCY SYNTHESIZERS which discloses the use of multiple single side band (SSB) mixers for a range of frequency ratios based on the output frequency and the reference frequency. While this invention enables performance across a wide frequency range, the use of multiple SSB mixers, ratio dividers and associated control circuitry is a complex approach to providing a wide frequency range with low noise.

SUMMARY

The improved frequency synthesis circuit described herein provides an improved output noise floor and wide frequency bandwidth while maintaining circuit simplicity, low cost and low power consumption. This circuit is implemented with many of the components integrated in a cost-effective manner, and uses mostly standard integrated circuits to achieve this goal.

The frequency synthesizer includes a PLL with a reference divider input, an integer divider input and a frequency output. The frequency output supplies an input signal to an integer divider which in turn supplies the integer divider input signal to the PLL. A reference oscillator supplies a local oscillator (LO) signal to a single side band (SSB) mixer and to an intermediate divider, with the intermediate divider supplying an intermediate frequency (IF) signal to the SSB mixer. The output of the SSB mixer is a signal frequency (RF) output which is supplied to a reference divider to produce the reference divider input for the PLL.

The frequency synthesizer is also realized with the same group of circuit elements in a second configuration. This alternate realization of the frequency synthesizer has a similar PLL circuit configuration with a reference divider input, an integer divider input and a frequency output, but with a reference oscillator supplying an input signal to a reference divider that in turn produces the reference divider input to the PLL. This reference divider input is also supplied to an intermediate divider which in turn supplies an IF signal to an SSB mixer, which supplies an RF output as an input signal to an integer divider which in turn supplies the integer divider input signal to the PLL. The frequency output is also supplied to the SSB mixer as an LO input. In some embodiments of this circuit configuration, the frequency output is scaled with a pre-scaler module before being supplied to the SSB mixer as an LO input.

OBJECTS AND FEATURES OF THE INVENTION

It is an object of the present invention to provide a PLL frequency synthesizer circuit that has a frequency resolution on the order of a few Hertz.

It is a further object of the present invention to provide a PLL frequency synthesizer circuit that has an output noise floor on the order of −100 dB.

It is yet another object of the present invention to provide a PLL frequency synthesizer circuit usable over the entire range of frequency bandwidth covered by the chosen circuit technology with a single I/Q modulator.

It is still another object of the present invention to have the option of using existing PLL integrated circuits (ICs) to realize the PLL portion of the frequency synthesis circuit, preferably even using lower cost and noisier PLL ICs.

It is a feature of the present invention to use a quadrature generator, frequency divider and 2 way/0 degree splitter to realize a single side band (SSB) mixer.

It is another feature of the present invention that the SSB mixer is realized by use of field effect transistors (FETs), digital logic inverters and T-type flip-flop gates.

BRIEF DESCRIPTION OF THE DRAWINGS

The present version of the invention will be more fully understood with reference to the following Detailed Description in conjunction with the drawings of which:

FIG. 6 is a chart showing the output power spectrum of the SSB mixer and the conversion loss at 99.9 MHz.

DESCRIPTION OF THE PREFERRED EMBODIMENT AND BEST MODE

The invention described herein is a frequency synthesizer using a PLL and an SSB mixer which is incorporated therein in two different configurations, namely in the feedback loop or in an input loop. The result and circuit topology with the combined PLL and SSB mixer is a frequency synthesizer with a wide band frequency output and a low noise floor.

Figure 1:
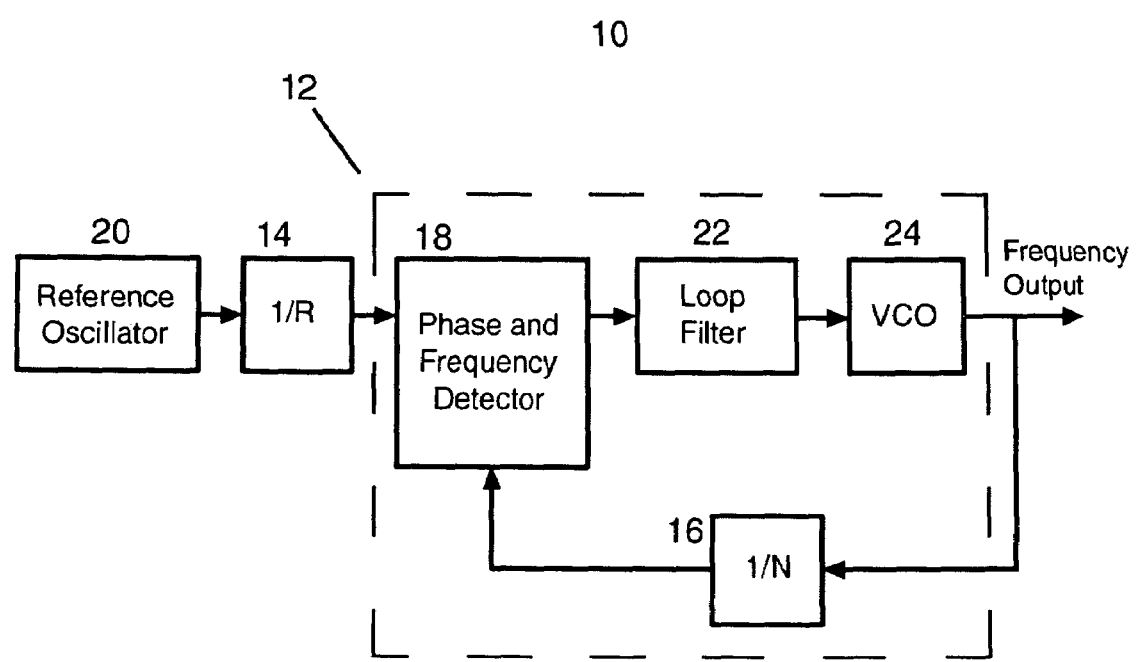
FIG. 1 is a block diagram of a frequency synthesizer.

The frequency synthesizer 10 shown in FIG. 1 is composed of a PLL 12, a reference oscillator 20 and a reference divider 14. In the classic configuration, the PLL 12 is composed of a phase and frequency detector 18, a loop filter 22, a VCO 24 and an integer divider 16. The reference divider 14 and integer divider 16 are also referred to as an R counter and an N counter, respectively. The signal path from the reference divider 14 to the phase and frequency detector 18 is referred to as the reference divider input path, and the signal path from the integer divider 16 to the phase and frequency detector 18 is referred to as the integer divider input path. Note that alternate realizations of PLLs in forms including ICs may include a separately indicated charge pump, may include a pre-scaler, or may be composed of a phase detector, a VCO and an amplifier circuit, or a reference divider, integer divider and phase and frequency detector, or other combinations of circuit elements well understood by persons of ordinary skill in the art.

The Output Noise Floor at the signal frequency (RF) output of the synthesizer is computed according to the following formula:

$$\text{Output\_Noise\_Floor} = \text{PLL\_Noise\_Floor} + 10 \text{Log}(F\text{-}comp) + 10 \text{Log}(N^2)$$

Where:

$$\text{Comparison\_Frequency} = Fcomp = \frac{Fref}{R} = \frac{Fout}{N}$$

This yields:

$$\text{Output\_Noise\_Floor} = \text{PLL\_Noise\_Floor} + 10\text{Log}(Fcomp * N^2)$$

$$\text{Output\_Noise\_Floor} = \text{PLL\_Noise\_Floor} + 10\text{Log}\left[\left(\frac{Fout}{N}\right) * N^2\right]$$

$$\text{Output\_Noise\_Floor} = \text{PLL\_Noise\_Floor} + 10\text{Log}(Fout * N)$$

Thus for a given output frequency Fout, increasing the comparison frequency improves the Output Noise Floor since it decreases N. Simply increasing the comparison frequency to the maximum possible level has the disadvantage with a given PLL circuit of leading to a poor frequency resolution, as the comparison frequency also determines the frequency resolution of the frequency synthesizer.

In the past, an approach to resolving this problem has been to add an I/Q modulator between the output of the VCO 24 and the input of the integer divider 16. (Note that the VCO output is also identified as the frequency output signal for the frequency synthesizer.) An I/Q modulator functions by modulating two orthogonal data streams onto a common carrier. If the phases and amplitudes of both data stream (in-phase "I" and quadrature "Q"), then one of the sidebands is completely cancelled out. In this manner, the frequency resolution of the frequency synthesizer is the same as the I/Q modulator and can be as low as a few Hertz.

Disadvantages of adding the I/Q modulator into the circuit include difficulties in operating the I/Q modulator at high frequencies and generating the two 90 degree I/Q (quadrature) signals necessary for operation, as well as requiring a separate I/Q modulator for every frequency band.

Figure 2:
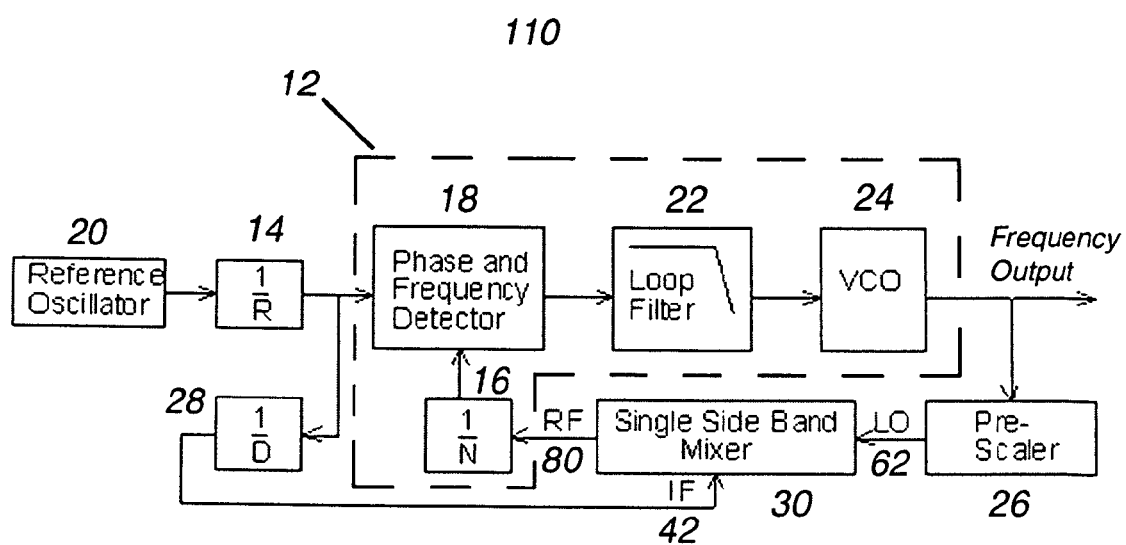
FIG. 2 is a block diagram of a frequency synthesizer showing an SSB mixer incorporated into the feedback loop of the PLL.

A more versatile and robust approach is to replace the standard I/Q modulator with a single side band mixer 30, as shown in FIG. 2. A frequency synthesizer 110 feeds the Frequency output signal from the VCO 24 into a pre-scaler 26 to produce the local oscillator (LO) signal 62. The pre-scaler is necessary if for example the PLL circuitry is composed of CMOS elements with a frequency limit in the range of hundreds of MHz, and the PLL is operated at higher frequencies, including in the GHz range. A pre-scaler realized in a GaAs integrated circuit technology functions at these higher frequencies and converts the signal to a lower frequency range suitable for operation of the PLL. This is combined in the single side band mixer 30 with the intermediate frequency (IF) signal 42 output from an intermediate divider 28 that is fed by the output from the reference divider 14. This requires the PLL 12 to have the reference divider output available as an external signal, if the PLL 12 is an IC incorporating the reference divider 14. The IF and LO signals input to the single side band mixer 30 produce an RF signal 80 which is input to the integer divider 16. Ideally, the input signals applied to the SSB mixer 30 have a duty cycle of 50%. Note that the intermediate divider 28 may also be referred to as a D counter.

Figure 4:
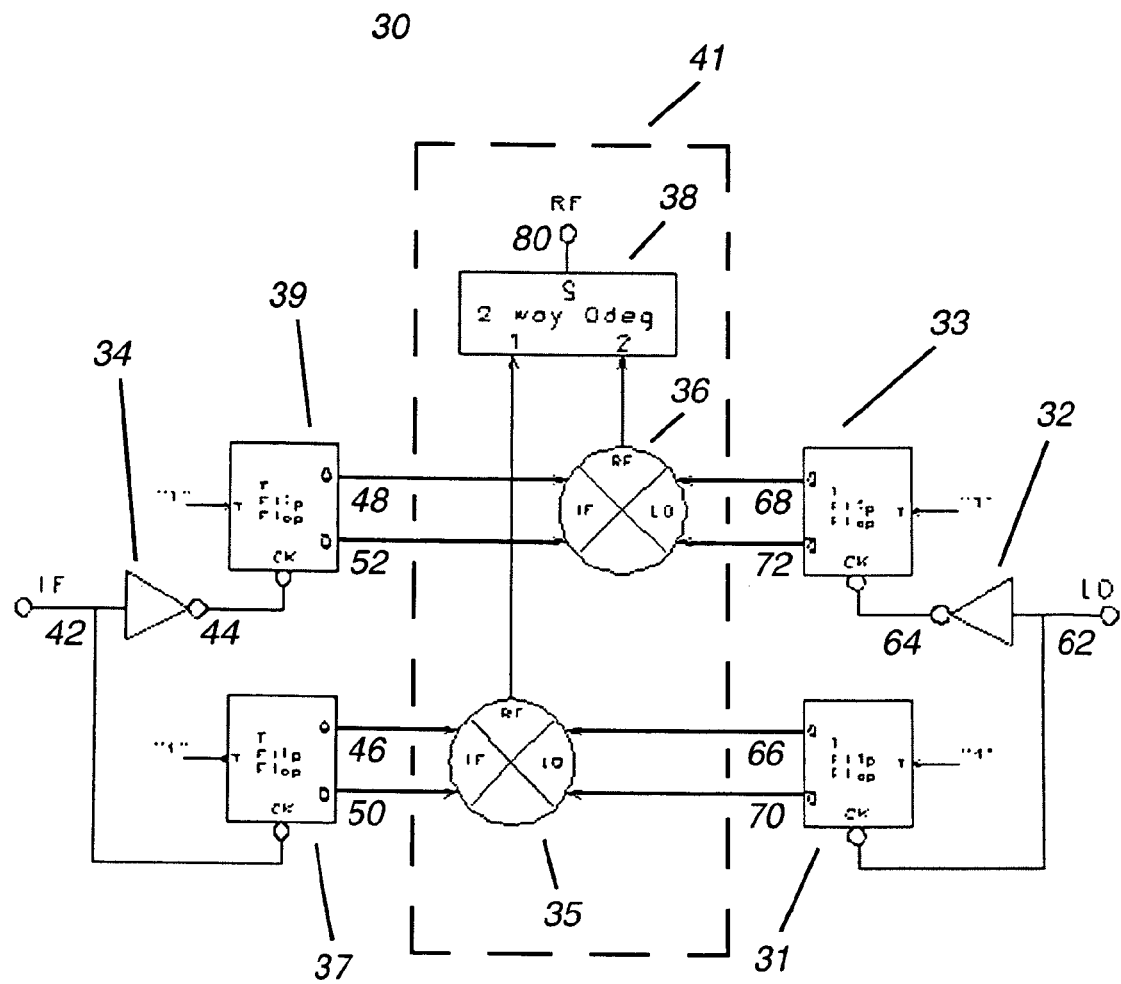
FIG. 4 is a block diagram of an SSB mixer incorporating T-type flip-flops therein.

The single side band mixer 30 circuit is shown in FIG. 4. There are two component groups each composed of an inverter and a pair of T flip-flops, wherein each component group functions as a quadrature generator to yield the output phase shifted by 0, 90, 180 and 270 degrees. This is performed for both the LO signal 62 and the IF signal 42. The LO signal 62 is fed into a first inverter 32, yielding an inverted LO signal 64. The LO signal 62 is also fed into the clock (CK) input of a first T flip-flop 31 yielding a 0 degree quadrature LO signal 66 and a 180 degree quadrature LO signal 70. (While the CK input is traditionally called a clock input, the use herein has no bearing on clock signals and the CK input is merely a useful input terminal.) The inverted LO signal 64 is fed into the CK input of a second T flip-flop 33 yielding a 90 degree quadrature LO signal 68 and a 270 degree quadrature LO signal 72. Likewise, the IF signal 42 is fed into a second inverter 34, yielding an inverted IF signal 44. The IF signal 42 is also fed into the CK input of a third T flip-flop 37 yielding a 0 degree quadrature IF signal 46 and a 180 degree quadrature IF signal 50. The inverted IF signal 44 is fed into the CK input of a fourth T flip-flop 39 yielding a 90 degree quadrature IF signal 48 and a 270 degree quadrature IF signal 52. These IF quadrature signals are at half the frequency of the IF signal 42 and are fed along with the LO quadrature signals at half the frequency of the LO signal 62 into a mixer-splitter circuit 41 constructed of a first mixer 35, a second mixer 36 and a combiner realized by a 2-way/0 degree splitter 38. The RF output frequency is either:

$$\frac{f_{LO}+f_{IF}}{2} \text{ or } \frac{f_{LO}-f_{IF}}{2}$$

but it will not be both expressions at once. The frequency resolution of this type of PLL circuit will be the IF, also stated as:

$$\text{Step\_Size} = \frac{Fcomp*N}{2*D} = \frac{Fout}{2*D}$$

Figure 5:
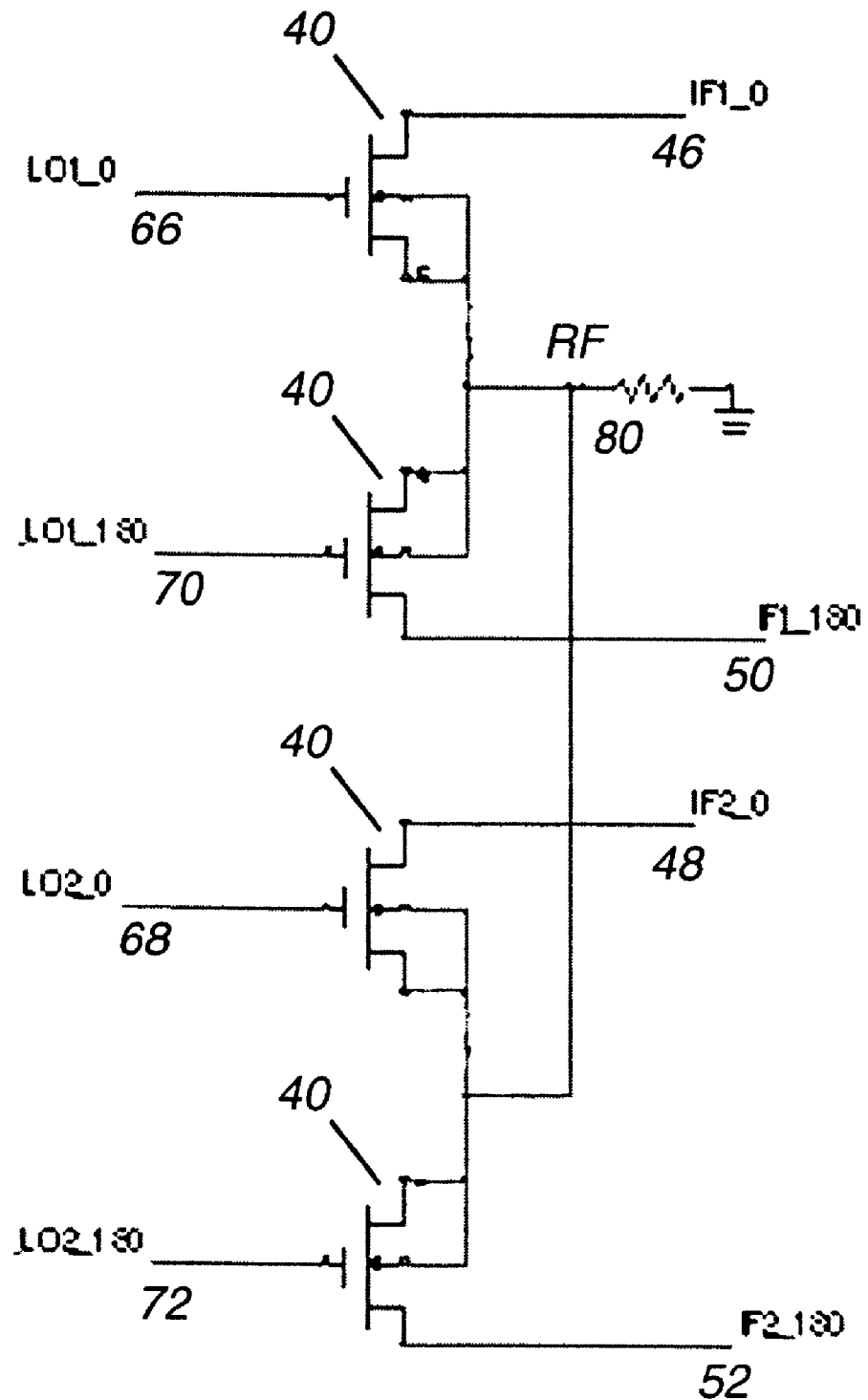
FIG. 5 is a circuit diagram showing the mixer and splitter elements of the SSB mixer of FIG. 4.

The mixer-splitter circuit 41 comprising a first mixer 35, a second mixer 36 and a combiner realized by a 2-way/0 degree splitter 38 is shown in a more essential component form in FIG. 5. The mixer and combiner functions are accomplished with four field effect transistors (FETs) 40 wherein the LO inputs are connected to the FET 40 gate terminals and the IF inputs are connected to the FET 40 drain terminals. (Note that the LO and IF inputs can be interchanged and the circuit will still function properly.) The FET 40 source terminals are connected together and to a load resistor referenced to ground. The signal seen at the load resistor is the RF signal 80. This is an internal signal for the frequency synthesizer, as opposed to the signal labeled Frequency Output in FIGS. 1, 2 & 3 which is the actual output signal from the frequency synthesizer.

This SSB mixer circuit has advantages over the prior art including the ability to function from DC up to the lower of the maximum frequencies of the inverter and T flip-flops. Typical prior art SSB mixer circuits are only useful over a very narrow frequency band due to the limited bandwidth of the internal 90 degree splitters employed. The typical lower frequency to upper frequency ratio in these prior art SSB mixer circuits is on the order of 1.1:5.

To show the improvement in Output Noise Floor, let:

Fout=2000 MHz

Step_Size=100 kHz

Fref=50 MHz

PLL_Noise_Floor=−210 dBc/Hz

Using a standard Integer N PLL Chip would yield:

N=2000/0.1=20000

Fcomp=100 kHz

Thus yielding:

Output_Noise_Floor=−210+10*Log(100e3*20000*20000)=−74 dBc/Hz

Using this noise floor equation with the single side band mixer approach:

Fcomp=50 MHz

D=10000

N=2000/50=40

In this case yielding:

Output_Noise_Floor=−210+10*Log(50e6*40*40)=−101 dBc/Hz

Thus realizing an improvement of 27 dB in the output noise floor while maintaining simplicity in design. Note that in this example the maximum frequency at which the single side band mixer works is $$2000 \text{MHz} * \frac{2}{40} = 100 \text{MHz}$$

which is an inherent limit of the CMOS integrated circuit technology from which this circuit was modeled and constructed. If higher-speed circuit technologies are used to model and construct this device, the maximum operating frequency will increase.

Figure 3:
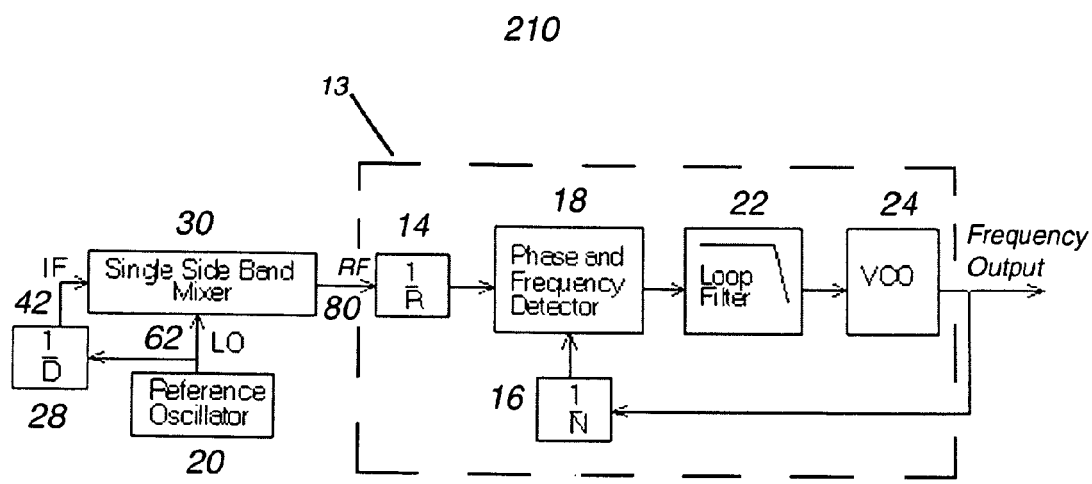
FIG. 3 is a block diagram of a frequency synthesizer showing an SSB mixer incorporated into an input loop producing an RF signal output for input to the PLL.

One disadvantage of this circuit topology is that if it is used with a PLL integrated circuit incorporating a reference divider, there must be a reference divider output. The preferred embodiment of the frequency synthesizer as shown in FIG. 3 is more suitable for use with PLL ICs incorporating a reference divider 14 and either having or lacking a reference divider output. Additionally, the preferred embodiment does not require a pre-scaler. The reference divider-included PLL 13 is shown in the frequency synthesizer 210 of FIG. 3. In this circuit topology, the modulation is performed on the reference input to the reference divider 14. The reference oscillator 20 outputs the LO signal 62 to the single side band mixer 30 and the intermediate divider 28. The intermediate divider 28 output is the IF signal 42 which is input to the SSB mixer 30, there combined with the LO signal 62 to output the RF signal 80 that is input to the PLL 12. As with the circuit topology incorporating the SSB mixer into the feedback loop of the PLL, the IF is the frequency resolution of the frequency synthesizer.

Prototyping and testing a circuit meant to be realized as a high-frequency integrated circuit out of discrete devices is an expensive and time-consuming task, and the physical realization has sources of error including mismatch between the discrete devices, mismatch between path lengths at higher frequencies and inaccurate frequency response due to disparities in actual versus intended device sizes. For many high-frequency circuit development applications, a more cost-effective and potentially more accurate way to evaluate circuit performance is the use of advanced computer models to simulate circuit performance.

An example of a high-frequency circuit modeling system is the Agilent Advanced Design System (ADS) which was created to assist with electronic design automation. Software of this type assists in the design of electronic circuitry intended to be incorporated in devices such as cellular and portable phones, pagers, wireless networks, and radar and satellite communications systems. In such a circuit modeling system, there are groups of equations for each type of circuit element. The user selects and connects the desired circuit elements, to which signal inputs are then applied and circuit response measured at selected nodes. The value and general methods of use of these modeling tools is well understood by persons of ordinary skill in the art.

FIG. 6 shows an ADS computer simulation of the spectrum of the output power of the SSB mixer 30. The output is shown in dBm, or dB referenced to 1 milliwatt. The four LO input frequencies are set to 100 MHz with a power of 17 dBm each and the four IF input frequencies are set to 0.1 MHz with a power of −10 dBm each. The LO and IF inputs are shown clearly in FIG. 4 and FIG. 5. The sum of the four IF inputs feeding into the SSB mixer 30 yield a total of −4 bBm. The desired RF out signal is 99.9 MHz, having a power of −11.554 dBm.

The ADS output display shown in FIG. 6 allows the user to select a given frequency for which to calculate conversion loss. The conversion loss (ConvLoss) is a measure of the efficiency of the mixer in providing translation between the input IF signals and the output RF signal, or IF power-RF power. In this case the ConvLoss at 99.9 MHz is −7.554 dB.

An alternate embodiment of the invention has the SSB mixer 30 comprising an integrated circuit.

Another alternate embodiment of the invention has the SSB mixer 30 and intermediate divider 28 comprising an integrated circuit.

Yet another alternate embodiment of the invention has the SSB mixer 30 and pre-scaler 26 comprising an integrated circuit.

Still another alternate embodiment of the invention has the SSB mixer 30, intermediate divider 28 and pre-scaler 26 comprising an integrated circuit.

An additional alternate embodiment of the invention incorporates a lowpass filter connected between the output of the SSB mixer 30 and the input to the integer divider 16.

Yet another additional alternate embodiment of the invention allows the IF signal to be applied to the SSB mixer 30 from an external source by the user, and not be limited by the intermediate divider 28.

A further alternate embodiment of the invention has the entire frequency synthesizer except for the reference oscillator 20 fabricated on a single IC.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A frequency synthesizer comprising:
    a phase-locked loop (PLL) with a feedback loop and a frequency output;
    said PLL having a phase and frequency detector, said phase and frequency detector with a reference divider input path and an integer divider input path;
    said integer divider input path being in said feedback loop of said PLL;
    a reference oscillator connected to said reference divider input path;
    a single side band (SSB) mixer having an intermediate frequency (IF) input and a local oscillator (LO) input and producing a signal frequency (RF) output signal;
    said RF output signal forming at least a portion of a signal path for said integer divider input path;
    a reference divider in said reference divider input path, said reference divider connected to said reference oscillator and providing input to said phrase and frequency detector;
    an intermediate divider connected to said reference divider input path, said intermediate divider providing said IF input to said SSB mixer;
    said frequency output providing said LO input to said SSB mixer;
    said RF out signal and said LO input comprising a portion of said integer divider input path;
    said SSB mixer, in turn, further comprising:
        a first inverter with an LO input and a first inverter output;
        a second inverter with an IF input and a second inverter output;
        a first T-type flip-flop having a first clock (CK) input, and a second T-type flip-flop having a second CK input, said LO input and said first inverter output connected respectively to said first and second CK inputs;
        a "1" logic signal connected respectively to said first T-type flip-flop T input and to said second T-type flip-flop T input;
        said first and second T-type flip-flop in combination producing LO quadrature outputs;
        a third T-type flip-flop having a third CK input, and a fourth T-type flip-flop having a fourth CK input, said IF input and said second inverter output connected respectively to said third and fourth CK inputs;
        said "1" logic signal connected respectively to said third T-type flip-flop T input and to said fourth T-type flip-flop T input;
        said third and fourth T-type flip-flop in combination producing IF quadrature outputs; and,
        a mixer-splitter circuit interconnected to said first, second, third and fourth T-type flip-flops, said mixer-splitter circuit, in turn, comprising:

a first mixer circuit connected to said first T-type flip-flop LO quadrature outputs and said third T-type flip-flop IF quadrature outputs, producing a first RF output;

a second mixer circuit connected to said second T-type flip-flop LO quadrature outputs and said fourth T-type flip-flop IF quadrature outputs, producing a second RF output; and, a 2-way 0 degree splitter connected to said first RF output and said second RF output and producing a mixer RF output signal proportional to a signal from the group consisting of the sum of the frequencies of said IF input and said LO input, and the difference of the frequencies of said IF input and said LO input.

2. A frequency synthesizer as described in claim 1, further comprising:

a pre-scaler connected to said frequency output and providing said LO input to said SSB mixer.

3. A frequency synthesizer as described in claim 1, wherein said mixer-splitter circuit further comprises:

a first FET with a first FET gate terminal, a first FET drain terminal and a first FET source terminal;

a first LO 0 degree phase shifted signal connected to said first FET gate terminal and a first IF 0 degree phase shifted signal connected to said first FET drain terminal;

a second FET with a second FET gate terminal, a second FET drain terminal and a second FET source terminal;

a first LO 180 degree phase shifted signal connected to said second FET gate terminal and a first IF 180 degree phase shifted signal connected to a second FET drain terminal;

a third FET with a third FET gate terminal, a third FET drain terminal and a third FET source terminal;

a second LO 0 degree phase shifted signal connected to said third FET gate terminal and a second IF 0 degree phase shifted signal connected to said third FET drain terminal;

a fourth FET with a fourth FET gate terminal, a fourth FET drain terminal and a fourth FET source terminal;

a second LO 180 degree phase shifted signal connected to said fourth FET gate terminal and a second IF 180 degree phase shifted signal connected to said fourth FET drain terminal;

wherein said LO and IF signals comprise respectively said LO and IF quadrature outputs; and, said first, second, third and fourth FET source terminals are connected commonly and to a load resistor, whereby said mixer RF output signal is present as a voltage across said load resistor.

4. A frequency synthesizer as described in claim 1, wherein said SSB mixer is incorporated into an integrated circuit.

5. A frequency synthesizer as described in claim 2, wherein said SSB mixer and said pre-scaler are incorporated into an integrated circuit.

6. A frequency synthesizer as described in claim 2, wherein said SSB mixer, said pre-scaler and said intermediate divider are incorporated into an integrated circuit.

7. A frequency synthesizer as described in claim 1, wherein a low pass filter is inserted in the signal path between said SSB mixer and said integer divider.

8. A frequency synthesizer as described in claim 1, wherein the entire frequency synthesizer except said reference oscillator is fabricated on a single IC.

9. A frequency synthesizer as described in claim 1, wherein said frequency output is a wide band output of up to at least 2000 MHz.

10. A frequency synthesizer as described in claim 1, wherein the output noise floor is no higher than −100 dB.

11. A frequency synthesizer comprising:

a reference oscillator producing a reference oscillator output;

a reference divider connected to said reference oscillator output and producing a reference divider output;

an intermediate divider connected to said reference divider output and producing an IF signal;

an integer divider having an integer divider input and producing an integer divider output;

a phase and frequency detector producing a phase and frequency detector output and having said integer divider output and said reference divider output as inputs;

a loop filter connected to said phase and frequency detector output and producing a loop filter output;

a VCO connected to said loop filter output and producing a VCO output;

said VCO output also being a frequency output for said frequency synthesizer;

a pre-scaler connected to said VCO output and producing an LO signal;

an SSB mixer connected to said IF signal and said LO signal and producing an RF signal; and, said RF signal being said integer divider input;

said SSB mixer, in turn, further comprising:

a first inverter with an LO input and a first inverter output;

a second inverter with an IF input and a second inverter output;

a first T-type flip-flop having a first clock (CK) input, and a second T-type flip-flop having a second CK input, said LO input and said first inverter output connected respectively to said first and second CK inputs;

a "1" logic signal connected respectively to said first T-type flip-flop T input and to said second T-type flip-flop T input;

said first and second T-type flip-flop in combination producing LO quadrature outputs;

a third T-type flip-flop having a third CK input, and a fourth T-type flip-flop having a fourth CK input, said IF input and said second inverter output connected respectively to said third and fourth CK inputs;

said "1" logic signal connected respectively to said third T-type flip-flop T input and to said fourth T-type flip-flop T input;

said third and fourth T-type flip-flop in combination producing IF quadrature outputs.

12. A frequency synthesizer comprising:

a phase-locked loop (PLL) with a feedback loop and a frequency output;

said PLL having a phase and frequency detector, said phase and frequency detector with a reference divider input path and an integer divider input path;

said integer divider input path being in said feedback loop of said PLL;

a reference oscillator connected to said reference divider input path;

a single side band (SSB) mixer having an intermediate frequency (IF) input and a local oscillator (LO) input and producing a signal frequency (RF) output signal;

said RF output signal forming at least a portion of a signal path for said integer divider input path;

a reference divider in said reference divider input path, said reference divider connected to said reference oscillator and providing input to said phrase and frequency detector;

an intermediate divider connected to said reference divider input path, said intermediate divider providing said IF input to said SSB mixer;

said frequency out providing said LO input to said SSB mixer;

said RF out signal and said LO input comprising a portion of said integer divider input path;

said SSB mixer, in turn, further comprising;
- a first inverter with an LO input and a first inverter output;
- a second inverter with an IF input and a second inverter output;
- a first T-type flip-flop having a first clock (CK) input, and a second T-type flip-flop having a second CK input, said LO input and said first inverter output connected respectively to said first and second CK inputs;
- a "1" logic signal connected respectively to said first T-type flip-flop T input and to said second T-type flip-flop input;
- said first and second T-type flip-flop in combination producing LO quadrature outputs;
- a third T-type flip-flop having a third CK input, and a fourth T-type flip-flop having a fourth CK input, said IF input and said second inverter output connected respectively to said third and fourth CK inputs;
- said "1" logic signal connected respectively to said third T-type flip-flop T input and to said fourth T-type flip-flop T input;
- said third and fourth T-type flip-flop in combination producing IF quadrature outputs; and,
- a mixer-splitter circuit interconnected to said first, second, third and fourth T-type flip-flops.

13. A frequency synthesizer as described in claim 12, further comprising:
a prescaler connected to said frequency output and providing said LO input to said SSB mixer.

14. A frequency synthesizer as described in claim 12, wherein said mixer-splitter further comprises:
a first mixer circuit connected to said first T-type flip-flop LO quadrature outputs and said third T-type flip-flop IF quadrature outputs, producing a first RF output;
a second mixer circuit connected to said second T-type flip-flop LO quadrature outputs and said fourth T-type flip-flop IF quadrature outputs, producing a second RF output; and,
a 2-way 0 degree splitter connected to said first RF output and said second RF output and producing a mixer RF output signal proportional to a signal from the group consisting of the sum of the frequencies of said IF input and said LO input, and the difference of the frequencies of said IF input and said LO input.

15. A frequency synthesizer as described in claim 14, wherein said mixer-splitter circuit further comprises:
a first FET with a first FET gate terminal, a first FET drain terminal and a first FET source terminal;
a first LO 0 degree phase shifted signal connected to said first FET gate terminal and a first IF 0 degree phase shifted signal connected to said first FET drain terminal;
a second FET with a second FET gate terminal, a second FET drain terminal and a second FET source terminal;
a first LO 180 degree phase shifted signal connected to said second FET gate terminal and a first 180 degree phase shifted signal connected to a second FET drain terminal;
a third FET with a third FET gate terminal, a third FET drain terminal and a third FET source terminal;
a second LO 0 degree phase shifted signal connected to said third FET gate terminal and a second IF 0 degree phase shifted signal connected to said third FET drain terminal;
a fourth FET with a fourth FET gate terminal, a fourth FET drain terminal and a fourth FET source terminal;
a second LO 180 degree phase shifted signal connected to said fourth FET gate terminal and a second IF 180 degree phase shifted signal connected to said fourth FET drain terminal;
wherein said LO and IF signals comprise respectively said LO and IF quadrature outputs; and,
said first, second, third and fourth FET source terminals are connected commonly and to a load resistor, whereby said mixer RF output signal is present as a voltage across said load resistor.

16. A frequency synthesizer as described in claim 12, wherein said SSB mixer is incorporated into an integrated circuit.

17. A frequency synthesizer as described in claim 12, wherein said SSB mixer and said pre-scaler are incorporated into an integrated circuit.

18. A frequency synthesizer as described in claim 12, wherein said SSB mixer, said pre-scaler and said intermediate divider are incorporated into an integrated circuit.

19. A frequency synthesizer as described in claim 12, wherein said IF output is externally generated and said input to said SSB mixer.

20. A frequency synthesizer as described in claim 12, wherein a low pass filter is inserted in the signal path between said SSB mixer and said integer divider.

21. A frequency synthesizer as described in claim 12, wherein the entire frequency synthesizer except said reference oscillator is fabricated on a single IC.

22. A frequency synthesizer as described in claim 12, wherein said frequency output is a wide band output of up to at least 2000 MHz.

23. A frequency synthesizer as described in claim 12, wherein the output noise floor is no higher than −100 dB.

* * * * *